US012730531B2

(12) United States Patent
Hong

(10) Patent No.: US 12,730,531 B2
(45) **Date of Patent: *Sep. 8, 2026**

(54) DISPLAY DEVICE INCLUDING MULTIPLEXER CIRCUIT AND METHOD OF DRIVING DISPLAY DEVICE

(71) Applicant: Samsung Display Co., Ltd., Yongin-si (KR)

(72) Inventor: Jin-Taek Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/805,463

(22) Filed: Aug. 14, 2024

(65) Prior Publication Data

US 2025/0093994 A1 Mar. 20, 2025

(30) Foreign Application Priority Data

Sep. 20, 2023 (KR) ........................ 10-2023-0125405

(51) Int. Cl.
*G06F 3/041* (2006.01)
*G06F 3/044* (2006.01)
*H10K 59/40* (2023.01)

(52) U.S. Cl.
CPC ...... *G06F 3/04164* (2019.05); *G06F 3/04182* (2019.05); *G06F 3/0443* (2019.05); *H10K 59/40* (2023.02)

(58) Field of Classification Search
CPC .......... G06F 3/041; G06F 3/044; H10K 59/40
See application file for complete search history.

(56) References Cited

U.S. PATENT DOCUMENTS

| | | | | |
|---|---|---|---|---|
| 8,970,544 | B1 | 3/2015 | Mohindra | |
| 2017/0160844 | A1* | 6/2017 | Li | G02F 1/13338 |
| 2020/0167040 | A1* | 5/2020 | Shepelev | G06F 3/047 |
| 2023/0238393 | A1* | 7/2023 | Katsuta | G06F 3/0443 |
| 2024/0231520 | A1* | 7/2024 | Tseng | G06F 3/0443 |
| 2025/0077026 | A1* | 3/2025 | Huang | G06F 3/04164 |

* cited by examiner

*Primary Examiner* — Chun-Nan Lin
(74) *Attorney, Agent, or Firm* — Womble Bond Dickinson (US) LLP

(57) ABSTRACT

A display device includes: a display layer; a sensor layer on the display layer; and a sensor driver to drive the sensor layer. The sensor layer includes: a plurality of sensing electrodes; a plurality of sensing lines connected to the plurality of sensing electrodes, respectively; a multiplexer circuit connected to the plurality of sensing lines, and including a control transistor including a gate electrode; and a connection line connected between the multiplexer circuit and the sensor driver. The sensor driver includes a sensing circuit connected between the connection line and the gate electrode of the control transistor, and to output a control signal to the gate electrode of the control transistor based on a sensing signal of the connection line.

13 Claims, 7 Drawing Sheets

DISPLAY DEVICE INCLUDING MULTIPLEXER CIRCUIT AND METHOD OF DRIVING DISPLAY DEVICE

CROSS-REFERENCE TO RELATED APPLICATION

The present application claims priority to and the benefit of Korean Patent Application No. 10-2023-0125405, filed on Sep. 20, 2023, in the Korean Intellectual Property Office, the entire disclosure of which is incorporated by reference herein.

BACKGROUND

1. Field

Aspects of embodiments of the present disclosure relate to a display device, and a method of driving the display device.

2. Description of the Related Art

An electronic device, such as a smartphone, a digital camera, a notebook computer, a navigation system, or a smart television, includes a display device for displaying an image to a user. The display device generates an image, and provides the image to the user through a display screen.

The display device includes a display panel that generates an image, and an input sensing part that is disposed on the display panel to sense an external input. The input sensing part includes a plurality of sensing electrodes for sensing an external input, and sensing lines connected to the sensing electrodes.

The above information disclosed in this Background section is for enhancement of understanding of the background of the present disclosure, and therefore, it may contain information that does not constitute prior art.

SUMMARY

Embodiments of the present disclosure may be directed to a display device having improved sensing reliability, and a method of driving the display device.

According to one or more embodiments of the present disclosure, a display device includes: a display layer; a sensor layer on the display layer; and a sensor driver configured to drive the sensor layer. The sensor layer includes: a plurality of sensing electrodes; a plurality of sensing lines connected to the plurality of sensing electrodes, respectively; a multiplexer circuit connected to the plurality of sensing lines, and including a control transistor including a gate electrode; and a connection line connected between the multiplexer circuit and the sensor driver. The sensor driver includes a sensing circuit connected between the connection line and the gate electrode of the control transistor, and configured to output a control signal to the gate electrode of the control transistor based on a sensing signal of the connection line.

In an embodiment, the sensor driver may be configured to output a driving signal to each of the plurality of sensing electrodes, and the driving signal may have a sinusoidal wave waveform.

In an embodiment, the sensing signal may have the sinusoidal wave waveform.

In an embodiment, the control signal may have the sinusoidal wave waveform.

In an embodiment, a voltage level of the control signal may vary depending on a voltage level of the sensing signal.

In an embodiment, the sensing circuit may include an operational amplifier.

In an embodiment, the operational amplifier may include: a first input node configured to receive a reference control signal; and a second input node connected to a current source electrically connected to the connection line.

In an embodiment, the control transistor may be a PMOS transistor.

In an embodiment, a voltage level of the control signal may be a negative level.

In an embodiment, a voltage level between the gate electrode and a source electrode of the control transistor may be uniform.

In an embodiment, each of the plurality of sensing electrodes may be configured to operate in a self-capacitance.

In an embodiment, the plurality of sensing electrodes may be located along a first direction and a second direction crossing the first direction.

In an embodiment, the display device may further include a circuit board on which the sensor driver may be mounted, and the circuit board may be connected to the display layer.

According to one or more embodiments of the present disclosure, a driving method of a display device including a display layer, a sensor layer on the display layer and including a plurality of sensing electrodes and a multiplexer circuit, and a sensor driver, includes: providing, by the sensor driver, a driving signal to each of the plurality of sensing electrodes; receiving, by the multiplexer circuit, a sensing signal from each of the plurality of sensing electrodes; receiving, by the sensor driver, the sensing signal from the multiplexer circuit; sensing, by a sensing circuit of the sensor driver, the sensing signal; generating, by the sensing circuit, a control signal based on the sensing signal; and outputting, by the sensing circuit, the control signal to the multiplexer circuit.

In an embodiment, the multiplexer circuit may include a control transistor including a gate electrode, and the outputting of the control signal may include outputting, by the sensing circuit, the control signal to the gate electrode of the control transistor.

In an embodiment, the providing of the driving signal may include providing, by the sensor driver, the driving signal having a waveform of a sinusoidal wave.

In an embodiment, the outputting of the control signal may include outputting, by the sensing circuit, the control signal having a waveform of a sinusoidal wave.

In an embodiment, the method may further include sensing, by the sensor driver, an external input based on the sensing signal.

In an embodiment, the sensing of the external input may include driving, by the sensor driver, the plurality of sensing electrodes in a self-capacitance scheme independently of each other.

In an embodiment, the outputting of the control signal to the gate electrode of the control transistor may include maintaining a voltage level between the gate electrode and a source electrode of the control transistor.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
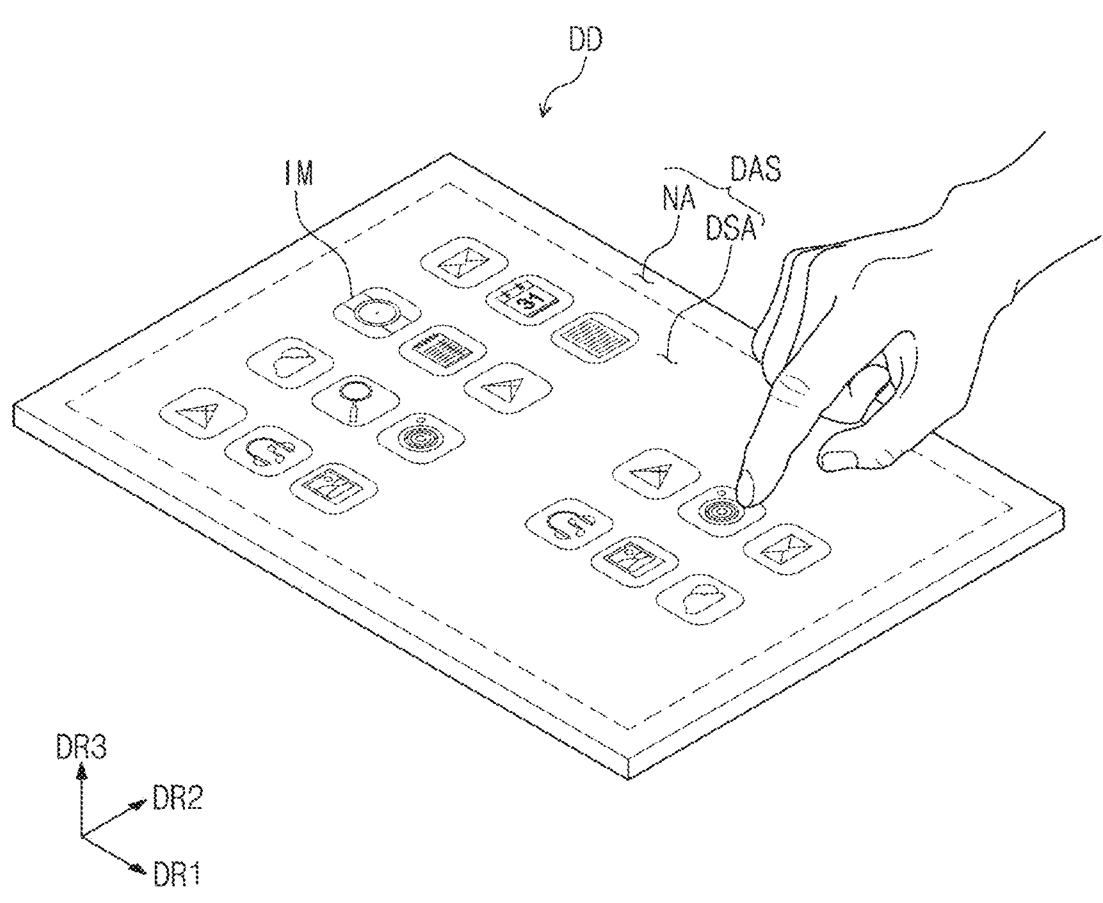
FIG. 1 is a perspective view illustrating a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device according to an embodiment of the present disclosure.

Referring to FIG. 1, a display device DD may be in the shape of a rectangle having long sides (or long edges) extending in a first direction DR1, and short sides (or short edges) extending in a second direction DR2 intersecting or crossing the first direction DR1. However, the present disclosure is not limited thereto. For example, the display device DD may have various suitable shapes, such as a circle, a polygon, or the like.

As used herein, a direction that is perpendicular or substantially perpendicular to a plane defined by the first direction DR1 and the second direction DR2 is defined as a third direction DR3. Also, as used herein, the expressions "when viewed from above a plane" and "in a plan view" refer to a state of being viewed in the third direction DR3.

An upper surface of the display device DD may be defined as a display surface DAS. The display surface DAS may correspond to the plane defined by the first direction DR1 and the second direction DR2. The display device DD may provide an image IM to the user through the display surface DAS in the third direction DR3.

The display surface DAS may include an active area DSA, and a non-active area NA around (e.g., adjacent to) the active area DSA. The active area DSA may display the image IM, and the non-active area NA may not display the image IM. The non-active area NA may surround (e.g., around a periphery of) the active area DSA, and may define a border of the display device DD, which is printed with a suitable color (e.g., a given or predetermined color).

The display device DD may be used in large-sized electronic devices, such as a television, a monitor, and an outside billboard. Also, the display device DD may be used in small and medium-sized electronic devices, such as a personal computer, a notebook computer, a personal digital terminal, a car navigation unit (e.g., a navigation device), a game console, a smartphone, and a camera. However, the present disclosure is not limited thereto, and the display device DD may be applied to any suitable electronic device(s).

Figure 2:
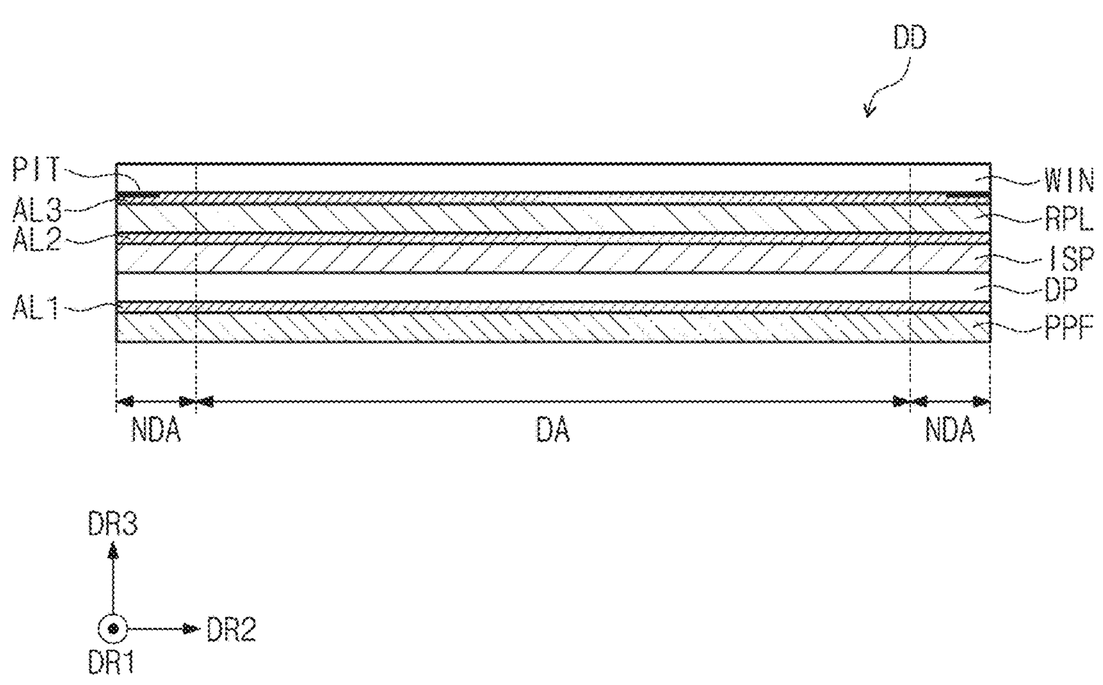
FIG. 2 is a cross-sectional view of a display device according to an embodiment of the present disclosure.

FIG. 2 is a cross-sectional view of a display device according to an embodiment of the present disclosure.

Referring to FIG. 2, the display device DD may include a display layer DP, a sensor layer ISP, a reflection preventing layer RPL, a window WIN, a printed layer PIT, a panel protecting film PPF, and first to third adhesive layers AL1 to AL3.

The display layer DP may be a flexible display panel. The display layer DP may be a light emitting display panel, but the present disclosure is not limited thereto. For example, the display layer DP may be an organic light emitting display panel, a quantum dot light emitting display panel, a micro-LED display panel, or a nano-LED display panel. A light emitting layer of the organic light emitting display panel may include an organic light emitting material. A light emitting layer of the quantum dot light emitting display panel may include a quantum dot, a quantum rod, and/or the like. A light emitting layer of the micro-LED display panel may include a micro-LED. A light emitting layer of the nano-LED display panel may include a nano-LED.

The sensor layer ISP may be disposed on the display layer DP. The sensor layer ISP may include a plurality of sensors for sensing an external input in a capacitive scheme. The sensor layer ISP may be manufactured directly on the display layer DP when the display device DD is manufactured. However, the present disclosure is not limited thereto. For example, the sensor layer ISP may be manufactured as a separate panel independently of the display layer DP, and may then be attached to the display layer DP by an adhesive layer.

The reflection preventing layer RPL may be disposed on the sensor layer ISP. The reflection preventing layer RPL may be defined as a film for preventing or substantially preventing external light from being reflected. The reflection preventing layer RPL may reduce the reflectance of the external light incident toward the display layer DP from above (e.g., at a front of) the display device DD.

When the external light traveling toward the display layer DP is reflected from the display layer DP and then provided to the user, like a mirror, the user may visually perceive the external light. To reduce or prevent the reflection, in an embodiment, the reflection preventing layer RPL may include a plurality of color filters for displaying the same colors as those of pixels of the display layer DP.

The color filters may filter the external light with the same colors as those of the pixels. In this case, the external light may not be visually perceived by the user. However, the present disclosure is not limited thereto. For example, the reflection preventing layer RPL may include a polarization film that includes a retarder and/or a polarizer to reduce the reflectance of the external light.

The window WIN may be disposed on the reflection preventing layer RPL. The window WIN may protect the display layer DP, the sensor layer ISP, and the reflection preventing layer RPL from external scratches and impacts.

The printed layer PIT may be disposed on a lower surface of the window WIN. The printed layer PIT may be disposed in a non-display area NDA. The printed layer PIT may be disposed to be closer to the outside than a border of a display area DA. The printed layer PIT may be printed with a desired color (e.g., a given or predetermined color), and may define the border of the display device DD.

The panel protecting film PPF may be disposed under the display layer DP. The panel protecting film PPF may protect a lower portion of the display layer DP. The panel protecting film PPF may include a flexible plastic material, such as polyethylene terephthalate (PET).

The first adhesive layer AL1 may be disposed between the display layer DP and the panel protecting film PPF. The display layer DP and the panel protecting film PPF may be connected to or attached to (e.g., tightly coupled to) each other by the first adhesive layer AL1.

The second adhesive layer AL2 may be disposed between the reflection preventing layer RPL and the sensor layer ISP. The reflection preventing layer RPL and the sensor layer ISP may be connected to or attached to (e.g., tightly coupled to) each other by the second adhesive layer AL2.

The third adhesive layer AL3 may be disposed between the window WIN and the reflection preventing layer RPL. The window WIN and the reflection preventing layer RPL may be connected to or attached to (e.g., tightly coupled to) each other by the third adhesive layer AL3. The printed layer PIT may be attached to the reflection preventing layer RPL by the third adhesive layer AL3.

Figure 3:
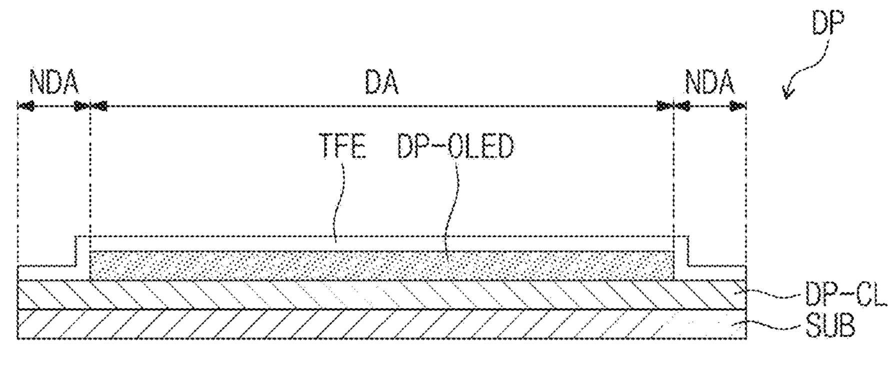
FIG. 3 is a cross-sectional view of a display panel according to an embodiment of the present disclosure.
Figure 3:
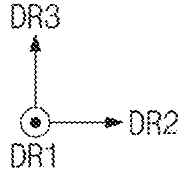

FIG. 3 is a cross-sectional view of a display panel according to an embodiment of the present disclosure.

Referring to FIG. 3, the display layer DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA, and the non-display area NDA around (e.g., adjacent to) the display area DA. The substrate SUB may include a flexible plastic material, such as polyimide (PI). The display element layer DP-OLED may be disposed in the display area DA.

A plurality of pixels may be disposed in the circuit element layer DP-CL and the display element layer DP-OLED. Each of the pixels may include a transistor disposed in the circuit element layer DP-CL, and a light emitting element disposed in the display element layer DP-OLED and connected to the transistor. A configuration of the pixel will be described in more detail below.

The thin film encapsulation layer TFE may be disposed on the circuit element layer DP-CL so as to cover the display element layer DP-OLED. The thin film encapsulation layer TFE may include inorganic layers, and an organic layer between the inorganic layers. The inorganic layers may protect the pixels from moisture/oxygen. The organic layer may protect the pixels PX from foreign objects, such as dust particles.

Figure 4:
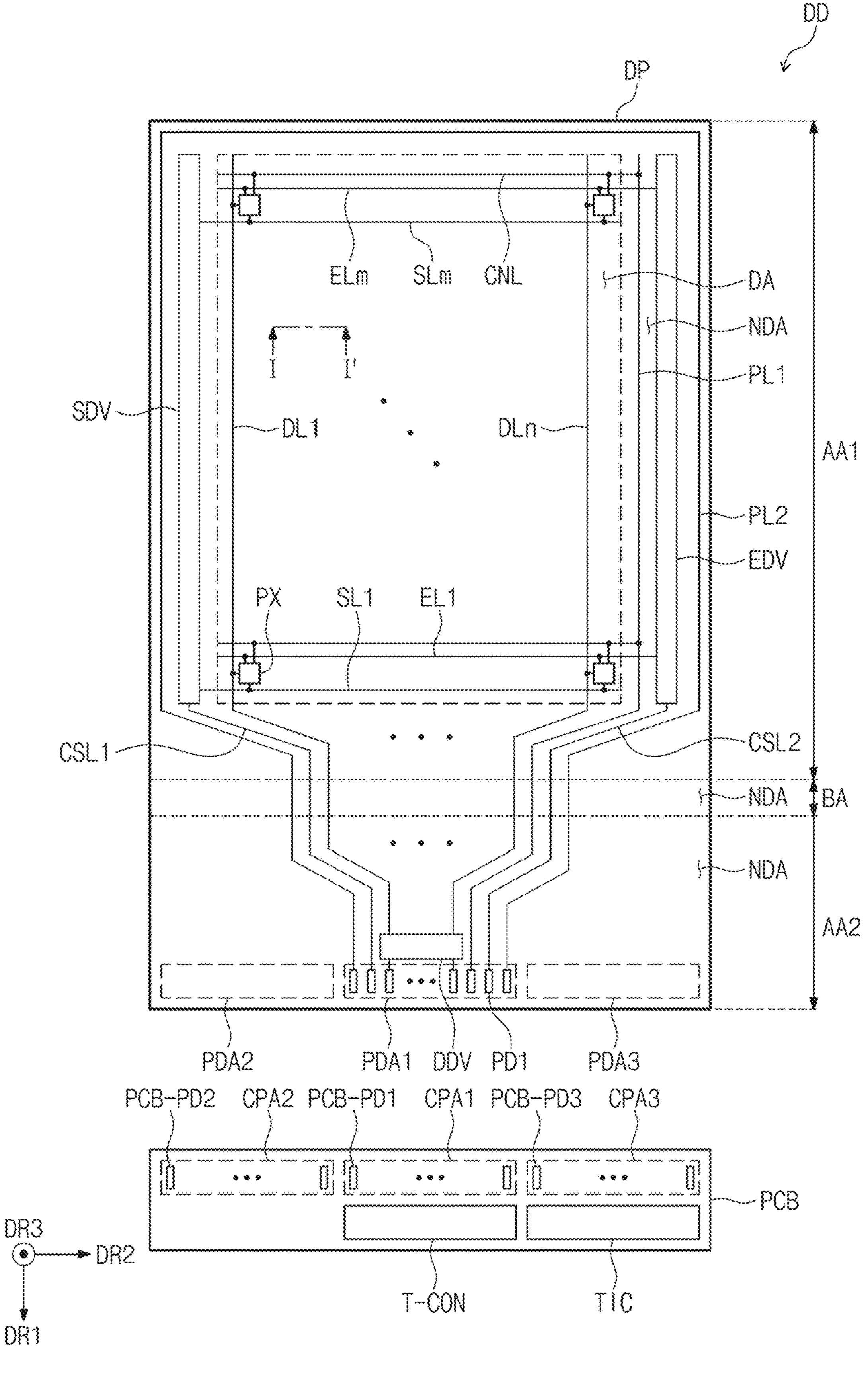
FIG. 4 is a plan view of a part of a display device according to an embodiment of the present disclosure.

FIG. 4 is a plan view of a part of a display device according to an embodiment of the present disclosure.

Referring to FIG. 4, the display device DD may include the display layer DP, a circuit board PCB, a timing controller T-CON, and a sensor driving unit (e.g., a sensor driver) TIC.

The display layer DP may be a flexible display panel. The display layer DP may extend to be longer in the first direction DR1 than in the second direction DR2. For example, the display layer DP may be in the shape of a rectangle having long sides (or long edges) extending in the first direction DR1, and short sides (or short edges) extending in the second direction DR2.

The display layer DP may include a first area AA1, a second area AA2, and a bending area BA disposed between the first area AA1 and the second area AA2. The bending area BA may extend in the second direction DR2, and the first area AA1, the bending area BA, and the second area AA2 may be arranged along the first direction DR1.

The first area AA1 may have long sides that extend in the first direction DR1, and are opposite to each other in the second direction DR2. The first area AA1 may include the display area DA, and the non-display area NDA around (e.g., adjacent to) the display area DA. The non-display area NDA may surround (e.g., around a periphery of) the display area DA. The display area DA may be defined as an area that displays the image IM (e.g., refer to FIG. 1). In a plan view, the display area DA may overlap with the active area DSA (e.g., refer to FIG. 1). The non-display area NDA may be defined as an area that does not display the image IM. In a plan view, the non-display area NDA may overlap with the non-active area NA.

The display layer DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, connection lines CNL, a plurality of first pads PD1, a scan driving unit (e.g., a scan driver) SDV, a data driving unit (e.g., a data driver) DDV, and an emission driving unit (e.g., an emission driver) EDV. Here, n and m may be natural numbers greater than 1.

The scan driving unit SDV and the emission driving unit EDV may be disposed in the non-display area NDA. For example, the scan driving unit SDV and the emission driving unit EDV may be disposed in the non-display area NDA so as to be adjacent to the long sides of the first area AA1, respectively. The data driving unit DDV may be disposed in the second area AA2. The data driving unit DDV may be manufactured in the form of an integrated circuit chip, and may be mounted in the second area AA2.

The scan lines SL1 to SLm may extend in the second direction DR2, and may be connected to the scan driving unit SDV. The data lines DL1 to DLn may extend from the first area AA1 in the first direction DR1, may extend to the second area AA2 through the bending area BA, and may be connected to the data driving unit DDV. The emission lines EL1 to ELm may extend in the second direction DR2, and may be connected to the emission driving unit EDV.

The first power line PL1 may extend in the first direction DR1, and may be disposed in the non-display area NDA. The first power line PL1 may be disposed between the display area DA and the emission driving unit EDV. However, the present disclosure is not limited thereto. The first power line PL1 may be disposed between the display area DA and the scan driving unit SDV.

The first power line PL1 may extend to the second area AA2 through the bending area BA. In a plan view, the first power line PL1 may extend to a lower end of the second area AA2. The first power line PL1 may receive a first voltage.

The second power line PL2 may be disposed in the non-display area NDA. The second power supply line PL2 may be disposed to be closer to the outside than the scan driving unit SDV and the emission driving unit EDV.

The second power line PL2 may extend to the second area AA2 through the bending area BA. The second power line PL2 may extend in the first direction DR1 in the second area AA2. In a plan view, the second power line PL2 may extend toward the lower end of the second area AA2.

The second power line PL2 may receive a second voltage having a voltage level that is lower than that of the first voltage. The second power line PL2 may extend to the display area DA, and may be connected to the pixels PX. The second voltage may be provided to the pixels PX through the second power line PL2.

The connection lines CNL may extend in the second direction DR2, and may be arranged along the first direction DR1. The connection lines CNL may be connected to the first power line PL1 and the pixels PX. The first voltage may be applied to the pixels PX through the first power line PL1 and the connection lines CNL that are connected to each other.

The first control line CSL1 may be connected to the scan driving unit SDV, and may extend to the lower end of the second area AA2 through the bending area BA. The second control line CSL2 may be connected to the emission driving unit EDV, and may extend to the lower end of the second area AA2 through the bending area BA. The data driving unit DDV may be disposed between the first control line CSL1 and the second control line CSL2.

A first pad area PDA1, a second pad area PDA2, and a third pad area PDA3 may be defined in a portion of the second area AA2, which is adjacent to the lower end of the second area AA2. Each of the first pad area PDA1, the second pad area PDA2, and the third pad area PDA3 may extend in the second direction DR2, and the first pad area PDA1, the second pad area PDA2, and the third pad area PDA3 may be arranged along the second direction DR2. The first pad area PDA1 may be disposed between the second pad area PDA2 and the third pad area PDA3.

The first pads PD1 may be disposed in the first pad area PDA1. The data driving unit DDV, the first power line PL1, the second power line PL2, the first control line CSL1, and the second control line CSL2 may be connected to the first pads PD1.

The data lines DL1 to DLn may be connected to corresponding pads from among the first pads PD1 through the data driving unit DDV. For example, the data lines DL1 to DLn may be connected to the data driving unit DDV, and the data driving unit DDV may be connected to the first pads PD1 corresponding to the data lines DL1 to DLn from among the first pads PD1, respectively.

The circuit board PCB may be connected to the display layer DP. The timing controller T-CON and the sensor driving unit TIC may be disposed on the circuit board PCB. For example, each of the timing controller T-CON and the sensor driving unit TIC may be manufactured in the form of an integrated circuit chip, and may be mounted on the circuit board PCB.

A first connection pad area CPA1, a second connection pad area CPA2, and a third connection pad area CPA3 may be defined in a portion of the circuit board PCB, which is adjacent to one side of the circuit board PCB. Each of the first connection pad area CPA1, the second connection pad area CPA2, and the third connection pad area CPA3 may extend in the second direction DR2, and the first connection pad area CPA1, the second connection pad area CPA2, and the third connection pad area CPA3 may be arranged along the second direction DR2. The first connection pad area CPA1 may be disposed between the second connection pad area CPA2 and the third connection pad area CPA3.

First pads PCB-PD1 may be disposed in the first connection pad area CPA1, second pads PCB-PD2 may be disposed in the second connection pad area CPA2, and third pads PCB-PD3 may be disposed in the third connection pad area CPA3. The first pads PD1 may be connected to the first pads PCB-PD1. The first pads PCB-PD1 may be connected to the timing controller T-CON. The second pads PCB-PD2 and the third pads PCB-PD3 may be connected to the sensor driving unit TIC.

The timing controller T-CON may control the operations of the scan driving unit SDV, the data driving unit DDV, and the emission driving unit EDV. The timing controller T-CON may generate a scan control signal, a data control signal, and an emission control signal in response to control signals from the outside.

The scan control signal may be provided to the scan driving unit SDV through the first control line CSL1. The emission control signal may be provided to the emission driving unit EDV through the second control line CSL2. The data control signal may be provided to the data driving unit DDV. The timing controller T-CON may receive image signals from the outside, may convert the data format of the image signals so as to be suitable for a specification of an interface with the data driving unit DDV, and may provide the converted image signals to the data driving unit DDV.

The scan driving unit SDV may generate a plurality of scan signals in response to the scan control signal. The scan signals may be applied to the pixels PX through the scan lines SL1 to SLm. The scan signals may be sequentially applied to the scan lines SL1 to SLm.

The data driving unit DDV may generate a plurality of data voltages corresponding to the image data in response to the data control signal. The data voltages may be applied to the pixels PX through the data lines DL1 to DLn. The emission driving unit EDV may generate a plurality of emission signals in response to the emission control signal. The emission signals may be applied to the pixels PX through the emission lines EL1 to ELm.

The pixels PX may be provided with the data voltages in response to the scan signals. The pixels PX may display the image IM (e.g., refer to FIG. 1) by emitting light having luminance values corresponding to the data voltages in response to the emission signals. The emission time of the pixels PX may be controlled by the emission signals.

Figure 5:
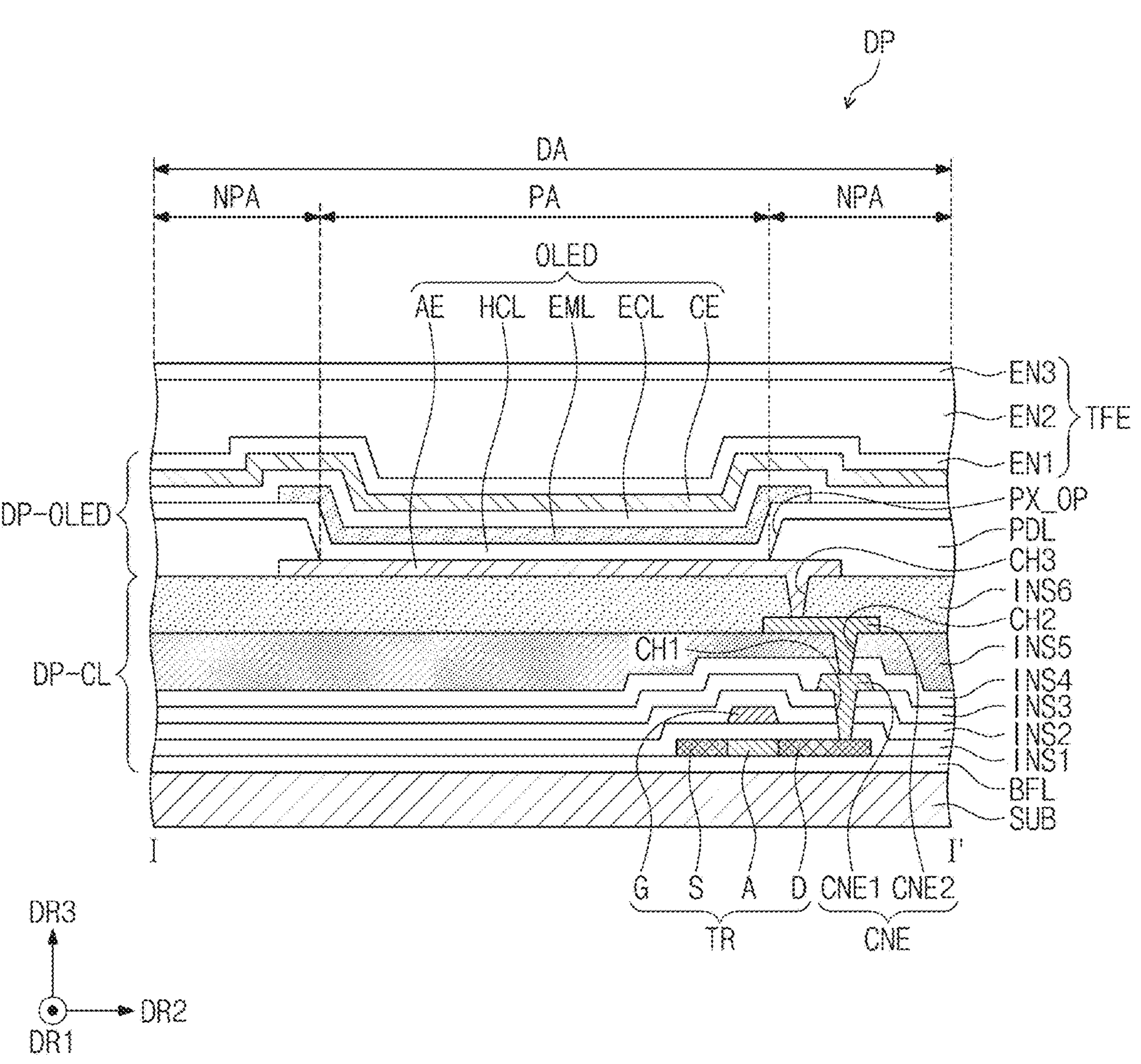
FIG. 5 is a cross-sectional view of a display panel taken along the line I-I' of FIG. 4 according to an embodiment of the present disclosure.

FIG. 5 is a cross-sectional view of a display panel taken along the line I-I' of FIG. 4 according to an embodiment of the present disclosure.

Referring to FIGS. 4 and 5, a transistor TR and a light emitting element OLED may be defined as a pixel from among the pixels PX. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. In an embodiment, one transistor TR is illustrated. However, substantially, the pixel PX may include a plurality of transistors for driving the light emitting element OLED, and at least one capacitor.

The display area DA may include a light emitting area PA corresponding to each of the pixels PX, and a non-light emitting area NPA around (e.g., adjacent to) the light emitting area PA. The light emitting element OLED may be disposed in the light emitting area PA.

A buffer layer BFL may be disposed on the substrate SUB. The buffer layer BFL may be an inorganic layer. A semiconductor pattern may be disposed on the buffer layer BFL. The semiconductor pattern may include polysilicon. However, the present disclosure is not limited thereto. For example, the semiconductor pattern may include amorphous silicon or a metal oxide.

The semiconductor pattern may be doped with an N-type dopant or a P-type dopant. The semiconductor pattern may include a highly doped area and a lightly doped area. A conductivity of the highly doped area may be greater than that of the lightly doped area. The highly doped area may operate or substantially operate as a source or a drain of the transistor TR. The lightly doped area may correspond to or substantially correspond to an active (e.g., a channel) of the transistor TR.

A source "S", an active "A", and a drain "D" of the transistor TR may be formed from the semiconductor pattern. A first insulating layer INS1 may be disposed on the semiconductor pattern. A gate "G" of the transistor TR may be disposed on the first insulating layer INS1. A second insulating layer INS2 may be disposed on the gate "G". A third insulating layer INS3 may be disposed on the second insulating layer INS2.

A connection electrode CNE may be disposed between the transistor TR and the light emitting element OLED, and may connect the transistor TR and the light emitting element OLED to each other. The connection electrode CNE may include a first connection electrode CNE1 and a second connection electrode CNE2.

The first connection electrode CNE1 may be disposed on the third insulating layer INS3, and may be connected to the drain "D" through a first contact hole CH1 defined in (e.g., penetrating) the first to third insulating layers INS1 to INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth insulating layer INS5. The second connection electrode CNE2 may be connected to the first connection electrode CNE1 through a second contact hole CH2 defined in (e.g., penetrating) the fourth and fifth insulating layers INS4 and INS5.

A sixth insulating layer INS6 may be disposed on the second connection electrode CNE2. The layers from the buffer layer BFL to the sixth insulating layer INS6 may be defined as the circuit element layer DP-CL. The first to sixth insulating layers INS1 to INS6 may be inorganic layers or organic layers.

The first electrode AE may be disposed on the sixth insulating layer INS6. The first electrode AE may be connected to the second connection electrode CNE2 through a third contact hole CH3 defined in (e.g., penetrating) the sixth insulating layer INS6. A pixel defining layer PDL exposing a portion of the first electrode AE may be disposed on the first electrode AE and the sixth insulating layer INS6. An opening PX_OP for exposing the portion of the first electrode AE may be defined in the pixel defining layer PDL.

The hole control layer HCL may be disposed on the first electrode AE and the pixel defining layer PDL. The hole control layer HCL may be disposed in common in the light emitting area PA and the non-light emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate light with one of a red color, a green color, and/or a blue color.

The electron control layer ECL may be disposed on the light emitting layer EML and the hole control layer HCL. The electron control layer ECL may be disposed in common in the light emitting area PA and the non-light emitting area NPA. The electron control layer ECL may include an electron transport layer and an electron injection layer.

The second electrode CE may be disposed on the electron control layer ECL. The second electrode CE may be disposed in the pixels PX in common. The layer in which the light emitting element OLED is disposed may be defined as the display element layer DP-OLED.

The thin film encapsulation layer TFE may be disposed on the second electrode CE so as to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may be inorganic layers, and the second encapsulation layer EN2 may be an organic layer. Each of the first and third encapsulation layers EN1 and EN3 may protect the pixel PX from moisture/oxygen. The second encapsulation layer EN2 may protect the pixel PX from foreign objects, such as dust particles.

The first voltage may be applied to the first electrode AE through the transistor TR, and the second voltage may be applied to the second electrode CE. Excitons may be formed when holes and electrons injected into the light emitting layer EML are bound. As the excitons transition to a ground state, the light emitting element OLED may emit light.

Figure 6:
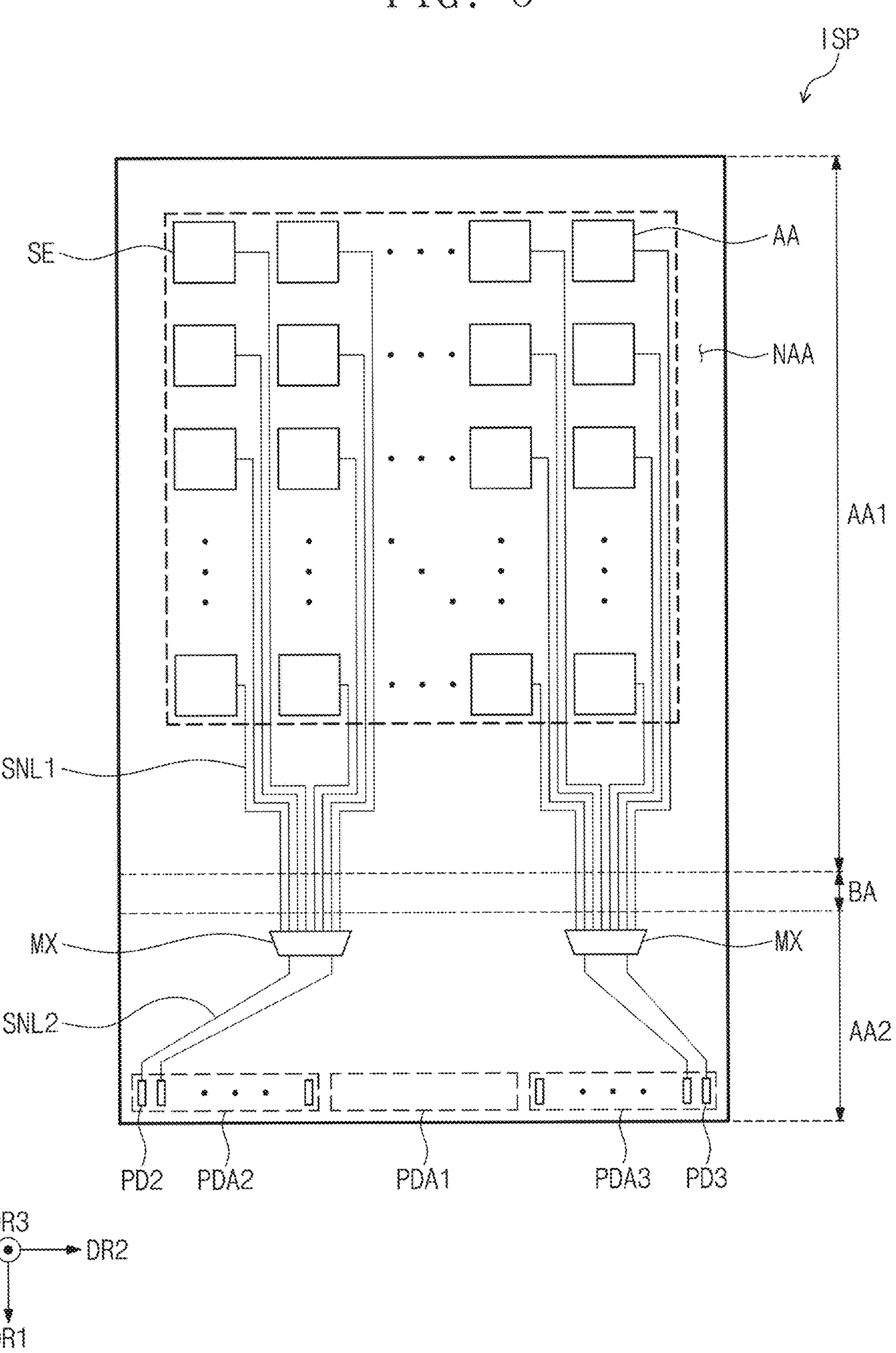
FIG. 6 is a plan view of a sensor layer according to an embodiment of the present disclosure.

FIG. 6 is a plan view of a sensor layer according to an embodiment of the present disclosure.

Referring to FIG. 6, the sensor layer ISP may include a plurality of sensing electrodes SE, a plurality of lines SNL1 and SNL2, a plurality of multiplexer circuits MX, and a plurality of second and third pads PD2 and PD3.

Like the display layer DP, a planar area of the sensor layer ISP may include the first area AA1, the second area AA2, and the bending area BA.

The first area AA1 may include an active area AA, and a non-active area NAA around (e.g., adjacent to) the active area AA. The non-active area NAA may surround (e.g., around a periphery of) the active area AA.

When viewed from above a plane (e.g., in a plan view), the active area AA may overlap with the display area DA (e.g., refer to FIG. 4), and the non-active area NAA may overlap with the non-display area NDA.

The second area AA2 and the bending area BA may be defined as the non-active area NAA.

The plurality of sensing electrodes SE may be disposed in the active area AA.

The plurality of second and third pads PD2 and PD3 may be disposed in the second area AA2.

The plurality of lines SNL1 and SNL2 may include a plurality of sensing lines SNL1 and a plurality of connection lines SNL2.

The plurality of sensing lines SNL1 may be connected to the plurality of sensing electrodes SE, and may extend to the second area AA2 through the bending area BA. For example, when viewed from above a plane (e.g., in a plan view), the plurality of sensing lines SNL1 may be connected to right sides of the plurality of sensing electrodes SE, respectively, and may extend in the first direction DR1. The plurality of sensing lines SNL1 may extend to the non-active area NAA.

The plurality of connection lines SNL2 may be disposed in the second area AA2. The plurality of connection lines SNL2 may be connected between the plurality of multiplexer circuits MX and the sensor driving unit TIC (e.g., refer to FIG. 4). The number of connection lines SNL2 may be less than the number of sensing lines SNL1. The plurality of connection lines SNL2 may be electrically connected to the plurality of second and third pads PD2 and PD3.

The plurality of sensing lines SNL1 and the plurality of connection lines SNL2 may be electrically connected to each other by the plurality of multiplexer circuits MX in a one-to-one correspondence.

The plurality of second and third pads PD2 and PD3 may be connected to the second and third pads PCB-PD2 and PCB-PD3 (e.g., refer to FIG. 4), respectively. The sensor driving unit TIC may control an operation of the sensor layer ISP through the plurality of second and third pads PD2 and PD3.

The plurality of sensing electrodes SE may have unique coordinate information. The plurality of sensing electrodes SE may be arranged along the first direction DR1 and the second direction DR2. For example, the plurality of sensing electrodes SE may be arranged in a matrix shape. However, the present disclosure is not limited thereto, and the arrangement of the plurality of sensing electrodes SE is not limited thereto.

The plurality of sensing electrodes SE may be connected to the plurality of sensing lines SNL1, respectively.

Each of the plurality of sensing electrodes SE may operate in a self-capacitance scheme. For example, the sensor driving unit TIC (e.g., refer to FIG. 4) may allow each of the plurality of sensing electrodes SE to operate as a driving electrode and a sensing electrode. Through the plurality of lines SNL1 and SNL2, the sensor driving unit TIC may apply a driving signal to each of the plurality of sensing electrodes SE, and may receive a sensing signal from each of the plurality of sensing electrodes SE. This will be described in more detail below.

The plurality of multiplexer circuits MX may be disposed in the second area AA2. The plurality of multiplexer circuits MX may be disposed between the plurality of sensing lines SNL1 and the plurality of connection lines SNL2. The plurality of multiplexer circuits MX may be adjacent to the bending area BA.

Figure 7:
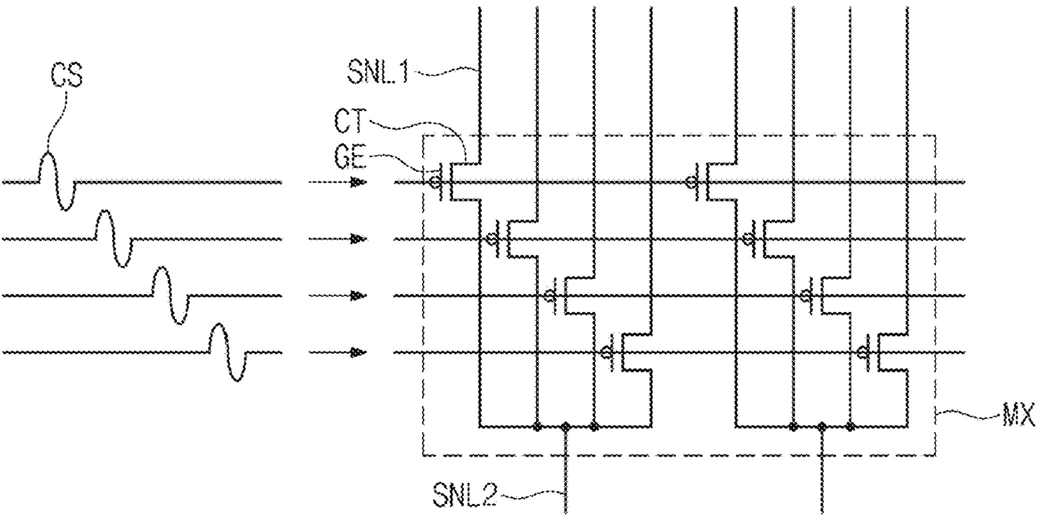
FIG. 7 is a circuit diagram illustrating a multiplexer circuit according to an embodiment of the present disclosure.

FIG. 7 is a circuit diagram illustrating a multiplexer circuit according to an embodiment of the present disclosure.

Referring to FIG. 7, the multiplexer circuit (e.g., each of the multiplexer circuits in FIG. 6) MX may include a plurality of control transistors CT.

Each of the plurality of control transistors CT may include a gate electrode GE, a first electrode, and a second electrode. Each of the plurality of control transistors CT may be a PMOS transistor. However, the present disclosure is not limited thereto, and the type of the plurality of control transistors CT is not limited thereto. For example, each of the plurality of control transistors CT may be an NMOS transistor.

The plurality of control transistors CT may be connected to the plurality of sensing lines SNL1 and the plurality of connection lines SNL2. The first electrode of each of the plurality of control transistors CT may be connected to a corresponding one of the plurality of sensing lines SNL1. The second electrode of each of the plurality of control transistors CT may be connected to either one of the plurality of connection lines SNL2.

Some of the plurality of control transistors CT may be connected in common to one of the plurality of connection lines SNL2, and the other remaining control transistors CT may be connected in common to the other one of the plurality of connection lines SNL2.

A control signal CS may be provided to the gate electrode GE of each of the plurality of control transistors CT. Each of the plurality of control transistors CT may be turned on by the control signal CS. The plurality of control transistors CT may be sequentially turned on by the control signal CS.

The control signal CS may be of a sinusoidal wave. For example, the control signal CS may be of a sine wave.

Through the plurality of lines SNL1 and SNL2 connected to each other by the plurality of multiplexer circuits MX, the driving signal may be applied to each of the plurality of sensing electrodes SE, and the sensing signal may be transmitted to the sensor driving unit TIC from each of the plurality of sensing electrodes SE.

Figure 8:
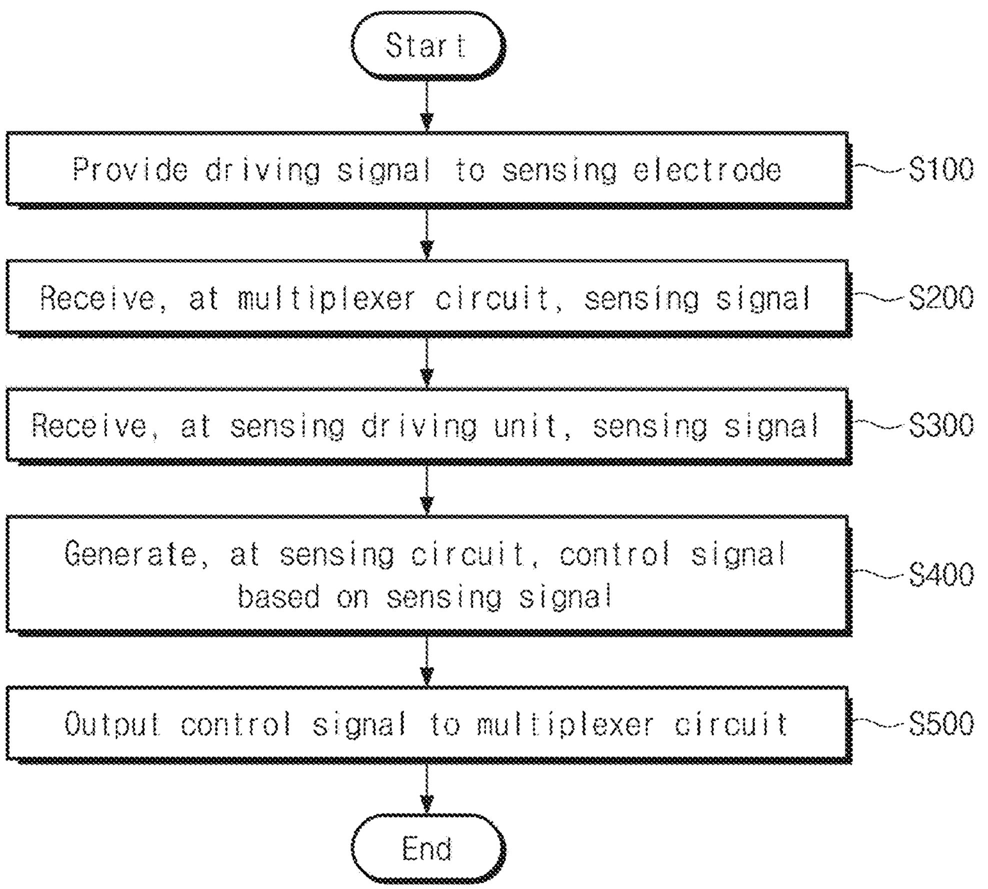
FIG. 8 is flowchart illustrating a driving method of a display device according to an embodiment of the present disclosure.
Figure 9:
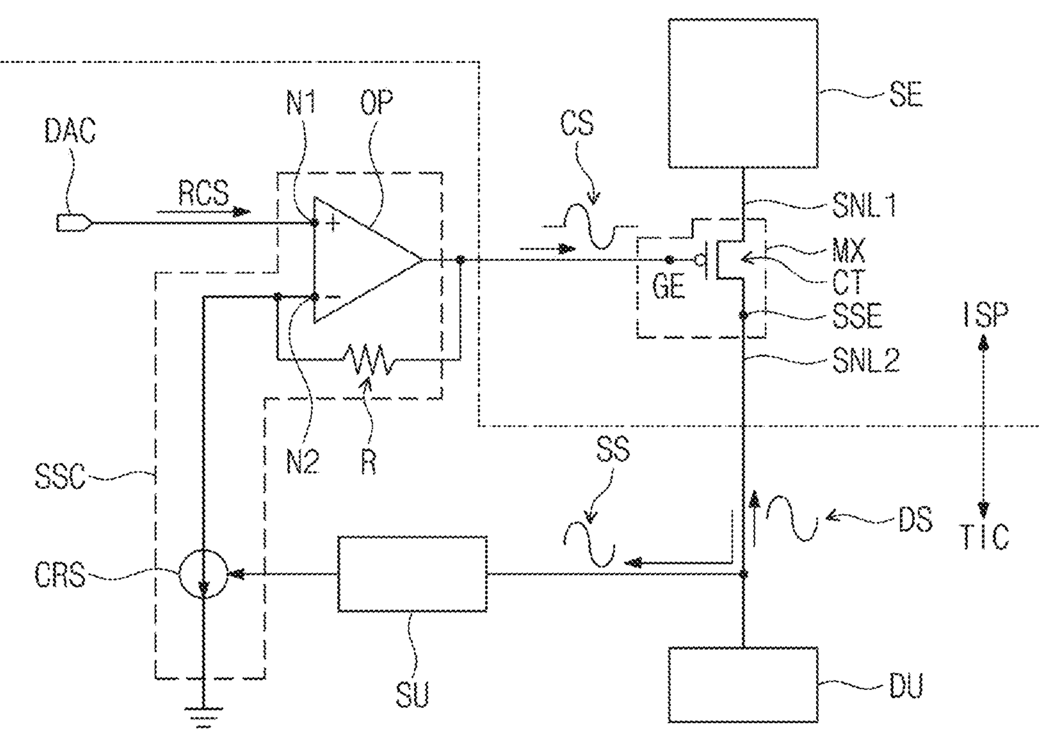
FIG. 9 is a block diagram illustrating a sensor layer and a sensor driving unit according to an embodiment of the present disclosure.

FIG. 8 is a flowchart illustrating a driving method of a display device according to an embodiment of the present disclosure. FIG. 9 is a block diagram illustrating a sensor layer and a sensor driving unit (e.g., a sensor driver) according to an embodiment of the present disclosure. For convenience of illustration, FIG. 9 illustrates a part of one multiplexer circuit MX (e.g., one of the control transistors CT from FIG. 7) from among the multiplexer circuits MX that is connected to one sensing electrode SE from among the sensing electrodes SE of FIG. 6.

Referring to FIGS. 8 and 9, the sensor driving unit TIC may include a driving signal output unit (e.g., a driving signal output circuit) DU, a sensing signal receiving unit (e.g., a sensing signal receiving circuit) SU, and a sensing circuit SSC.

The driving signal output unit DU may provide a driving signal DS to each of the plurality of sensing electrodes SE (S100). The driving signal DS may be provided to each of the plurality of sensing electrodes SE through the connection line SNL2 and the sensing line SNL1.

The driving signal DS may be of a sinusoidal wave. For example, the driving signal DS may be in the shape of a sine wave having one frequency.

In a comparative example in which the driving signal DS is in the shape of a square wave, the square wave may be formed of a plurality of frequencies. In this case, noise may occur due to a harmonic for each of the plurality of frequencies. However, according to one or more embodiments of the present disclosure, the driving signal DS may be in the shape of a sine wave having one frequency. The noise due to the harmonic may be prevented or removed. As such, the electromagnetic interference (EMI) due to the noise may be prevented or substantially prevented from being generated or may be removed. Accordingly, the display device DD (e.g., refer to FIG. 1) having improved reliability may be provided.

The multiplexer circuit MX may receive a sensing signal SS from each of the plurality of sensing electrodes SE (S200). The sensing signal SS may be provided to the control transistor CT of the multiplexer circuit MX through the sensing line SNL1.

The sensing signal SS may be of a sinusoidal wave. As the driving signal DS is provided in the shape of a sine wave, the sensing signal SS may also be in the shape of a sine wave. For example, the sensing signal SS may be in the shape of a sine wave that swings between −5 V and +5 V.

The sensing signal receiving unit SU may receive the sensing signal SS from the multiplexer circuit MX (S300). The sensing signal receiving unit SU may calculate coordinates of an external input based on the sensing signal SS.

The sensing circuit SSC may be connected between the connection line SNL2 and the gate electrode GE. The sensing circuit SSC may include an operational amplifier OP and a current source CRS.

The operational amplifier OP may include a first input node N1 and a second input node N2.

The first input node N1 may receive a reference control signal RCS. The reference control signal RCS may be received from a digital-to-analog converter (DAC). The reference control signal RCS may have a constant voltage. For example, the reference control signal RCS may have a voltage level of −8 V or −12 V. The first input node N1 may be referred to as a "positive input node".

The second input node N2 may be connected to the current source CRS that is electrically connected to the connection line SNL2. The second input node N2 may be referred to as a "negative input node".

A resistor "R" may be connected between the second input node N2 and an output node of the operational amplifier OP.

The current source CRS may adjust the amount of current that is provided to the second input node N2 in response to the sensing signal SS.

The sensing circuit SSC may sense the sensing signal SS, and may generate the control signal CS based on the sensing signal SS. The voltage level of the control signal CS may change depending on the voltage level of the sensing signal SS.

The sensing circuit SSC may output the control signal CS to the gate electrode GE based on the sensing signal SS. The control signal CS may be in the shape of a sinusoidal wave. For example, the control signal CS may be in the shape of a sine wave.

The voltage level Vgs between the gate electrode GE and a source electrode SSE of the control transistor CT may be uniform or substantially uniform.

The sensing circuit SSC may output the control signal CS to the multiplexer circuit MX (S500). The voltage level of the control signal CS may be a negative level. The control signal CS may turn on or turn off the control transistor CT being a PMOS transistor.

In a comparative example in which the sensing circuit SSC is not provided, the reference control signal RCS with a constant voltage may be provided to the gate electrode GE of the control transistor CT. Because the sensing signal SS is in the shape of a sine wave and the gate electrode GE is biased with a constant voltage, the voltage Vgs between the gate electrode GE and the source electrode SSE may be variable. In this case, a turn-on resistance of the control transistor CT may be variable. As such, a sensing signal having a sine wave that is disturbed may be output through the connection line SNL2. The sensing signal with the disturbed sine wave may cause a harmonic-based noise. However, according to one or more embodiments of the present disclosure, the sensing circuit SSC may sense the sensing signal SS, and may convert the reference control signal RCS to the control signal CS in the shape of the sine wave. As such, the voltage level Vgs between the gate electrode GE and the source electrode SSE of the control transistor CT may be uniform or substantially uniform. The distortion of the sensing signal SS may be prevented or removed. Accordingly, the display device DD (e.g., refer to FIG. 1) having improved reliability may be provided.

According to one or more embodiments of the present disclosure described above, a sensing circuit may sense a sensing signal, and may convert a reference control signal to a control signal in the shape of a sine wave. Both the control signal and the sensing signal may be in the shape of a sinusoidal wave. In this case, a voltage level Vgs between a gate electrode and a source electrode of a control transistor may be uniform or substantially uniform. The distortion of the sensing signal that a sensing signal receiving unit receives may be prevented or removed. Accordingly, a display device having improved sensing reliability may be provided.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:

a display layer;

a sensor layer on the display layer; and a sensor driver configured to drive the sensor layer, wherein the sensor layer comprises:

a plurality of sensing electrodes;

a plurality of sensing lines connected to the plurality of sensing electrodes, respectively;

a multiplexer circuit connected to the plurality of sensing lines, and comprising a control transistor including a gate electrode; and a connection line connected between the multiplexer circuit and the sensor driver, and wherein the sensor driver comprises a sensing circuit connected between the connection line and the gate electrode of the control transistor, and configured to output a control signal to the gate electrode of the control transistor based on a sensing signal of the connection line to electrically connect one of the plurality of sensing lines to the connection line when the control transistor is turned on by the control signal.

2. The display device of claim 1, wherein the sensor driver is configured to output a driving signal to each of the plurality of sensing electrodes, and wherein the driving signal has a sinusoidal wave waveform.

3. The display device of claim 2, wherein the sensing signal has the sinusoidal wave waveform.

4. The display device of claim 2, wherein the control signal has the sinusoidal wave waveform.

5. The display device of claim 2, wherein a voltage level of the control signal varies depending on a voltage level of the sensing signal.

6. The display device of claim 1, wherein the sensing circuit comprises an operational amplifier.

7. The display device of claim 6, wherein the operational amplifier comprises:

a first input node configured to receive a reference control signal; and a second input node connected to a current source electrically connected to the connection line.

8. The display device of claim 1, wherein the control transistor is a p-channel metal-oxide-semiconductor (PMOS) transistor.

9. The display device of claim 8, wherein a voltage level of the control signal is a negative level.

10. The display device of claim 1, wherein a voltage level between the gate electrode and a source electrode of the control transistor is uniform.

11. The display device of claim 1, wherein each of the plurality of sensing electrodes is configured to operate in a self-capacitance.

12. The display device of claim 1, wherein the plurality of sensing electrodes are located along a first direction and a second direction crossing the first direction.

13. The display device of claim 1, further comprising a circuit board on which the sensor driver is mounted, wherein the circuit board is connected to the display layer.

* * * * *